(12) United States Patent
Raveh et al.

(10) Patent No.: US 10,163,601 B1
(45) Date of Patent: Dec. 25, 2018

(54) PROBE ASSEMBLY WITH HIGH BANDWIDTH BEAM

(71) Applicant: Intel Corporation, Santa Clara, CA (US)

(72) Inventors: Amir Raveh, Haifa (IL); Travis Eiles, Beaverton, OR (US); Evgeny Gregory Nisenboim, Haifa (IL); Patrick Pardy, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/856,211

(22) Filed: Dec. 28, 2017

(51) Int. Cl.
| | |
|---|---|
| *G01R 31/305* | (2006.01) |
| *G01R 31/306* | (2006.01) |
| *G01R 31/302* | (2006.01) |
| *G01R 31/311* | (2006.01) |
| *H01J 37/073* | (2006.01) |
| *H01J 37/06* | (2006.01) |
| *H01J 37/244* | (2006.01) |
| *H01J 37/14* | (2006.01) |
| *H01J 37/28* | (2006.01) |

(52) U.S. Cl.
CPC ............ *H01J 37/073* (2013.01); *H01J 37/14* (2013.01); *H01J 37/244* (2013.01); *H01J 37/28* (2013.01); *H01J 2237/002* (2013.01); *H01J 2237/04753* (2013.01); *H01J 2237/14* (2013.01); *H01J 2237/2448* (2013.01)

(58) Field of Classification Search
USPC .............. 324/750.01, 750.3, 750.23, 754.22, 324/754.23, 754.01, 762.05, 763.01; 250/306, 307, 310
See application file for complete search history.

(56) References Cited

U.S. PATENT DOCUMENTS

| | | | | |
|---|---|---|---|---|
| 4,864,228 A | * | 9/1989 | Richardson | G01R 31/305 324/754.22 |
| 5,049,816 A | * | 9/1991 | Moslehi | G01R 31/2656 324/754.23 |
| 6,882,170 B2 | * | 4/2005 | Eiles | G01R 31/3161 324/750.03 |
| 6,917,209 B2 | * | 7/2005 | Ellison | G01R 31/311 324/754.23 |
| 2004/0108868 A1 | * | 6/2004 | Eiles | G01R 31/3161 324/750.03 |
| 2012/0217391 A1 | * | 8/2012 | Shichi | H01J 27/26 250/306 |

* cited by examiner

*Primary Examiner* — Bernard Souw
(74) *Attorney, Agent, or Firm* — Schwegman Lundberg & Woessner, P.A.

(57) ABSTRACT

A probe assembly for analyzing a test device that includes a housing with an electron source disposed therein for emitting primary electrons. A photon source is positioned to emit photons that strike the electron source such that when the photons strike the electron source, the electron source emits the primary electrons. Detection circuitry is provided that is configured to detect secondary electrons emitted from a test device of a test assembly and to form an excitation waveform.

25 Claims, 8 Drawing Sheets

PROBE ASSEMBLY WITH HIGH BANDWIDTH BEAM

TECHNICAL FIELD

This document pertains generally, but not by way of limitation, to semiconductor device testing and methods.

BACKGROUND

Semiconductors are materials that present properties of both conductance and insulation. Typically, a semiconductor material has four valence electrons allowing the material and consequently the semiconductor material to operate as both a conductor and as an insulator as an operator desires. One example of a known semiconductor device is a transistor.

When manufacturing semiconductor devices great care is taken to ensure the semiconductor device has been manufactured properly. As a result, there is a desire to test active semiconductor devices to ensure proper operation. Typically, a probe assembly is utilized to test a semiconductor device by generating an excitation waveform of the semiconductor to ensure proper operation.

The excitation waveforms are high frequency waveforms that cause difficulties in acquiring representations of the waveform using a probe assembly. Adding to this problem is that often the probe assembly must be used to test a semiconductor such as a transistor that is on board, or part of an integrated circuit (IC) that includes other electronic components, giving rise to spatial constraints.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Few probe assemblies and techniques exist that are able to accurately generate high frequency waveforms of a semiconductor. For example, electrical probes such as atomic force probes (AFP) or contact probes provide intrusive methods that prevent probing of a semiconductor while a test is being conducted on a device or system platform.

Therefore, non-intrusive techniques are utilized to generate a high frequency waveform of a semiconductor. As an example, optical probing such as visible light probing and infrared (IR) probing combine an optical wavelength in combination with a high numeral aperture (NA) lens to strike a test device to receive feedback that is sampled to form the waveform. Still, resolution scaling of optical probing solutions are insufficient for 5 nm and beyond process nodes.

In addition, while adjusting the optical wavelength of the optical probe to shorter wavelengths (UV range) theoretically improves resolution, using shorter wavelengths in practice is impractical. In particular, as wavelengths become shorter, a disproportional increase in absorption of the wavelength by the silicon occurs. Another concern for UV is generation of charge carriers that will alter the electrical properties of the device.

Electron beam probe assemblies also have been utilized to determine the waveform of an active semiconductor. Such probe assemblies emit a stroboscopic or pulsed beam of primary electrons onto the semiconductor. Currently, the electron beam is pulsed through a methodology referred to as blanking. Blanking is the deflection of the primary electron beam away from an aperture to temporarily prevent the beam from hitting the aperture. Typically, electrode plates are used to create a voltage potential that deflects the electron beam off course and away from the aperture opening. This adds complexity and costs when forming the electron column.

Blanking techniques are also ineffective at achieving sufficient bandwidth for accurate results. To ensure desired bandwidth, the primary electron beam needs to be pulsed, or interrupted, every 10 picoseconds (ps). Consequently, to provide the 10 ps pulse, the electrode plates theoretically would need to be 5 ps to give rise to the required electric field to create the voltage potential for deflection of the primary electron beam and another 5 ps for the voltage potential to drop back to zero before creating the next electric field for the next deflection. Implementing a gradient of this speed is problematic. Existing electron beam probe assemblies simply cannot achieve such speed, resulting in undesired accuracy in test results.

Additionally, in regard to electron probe beams, such electron beams require vacuum and the device under test must be inside a vacuum chamber. There are a number of options how to keep the device under test operational while probing it with the electron beam.

One such option is to use the tester or board as part of the enclosure of the vacuum chamber. In this case the electron beam apparatus with the open vacuum chamber docks to the tester or board forming a hermetically closed volume and then a pump is used to create vacuum within this enclosure. One of the challenges with this option is that after docking the test assembly does not move. Thus, for alignment, the electron column is moved perpendicularly after the docking. Unfortunately, moving a large column causes mechanical vibrations which are large relative to current device geometries. Such vibrations are detrimental to the resolution in advanced imaging and probing systems.

In order to overcome the deficiencies of these other probe assemblies and techniques, an electron beam probe assembly is utilized that pulses the primary electron beam without blanking. Instead of blanking, the voltage of the electron gun at just below a threshold voltage required for the primary electrons to emit from the electron gun. Then a pulsed laser beam is directed at the tip of the electron gun. When the laser beam strikes the tip of the electron gun, energy is increased at the tip resulting in an increase above the threshold voltage to cause the emission of electrons. When the laser is not emitting a beam during operation, no electrons emit from the tip of the electron gun.

In the context of testing an active electronic component to determine a voltage waveform, by controlling the emission of primary electrons with a laser beam, instead of through blanking, the generation of an electric field for blanking is eliminated and near to sub 10 ps pulsing is easily achieved. Therefore, an increased bandwidth together with very high resolution compared to previous probe assemblies and techniques is achieved where the number of electrons in each pulse may be controlled by the laser pulse energy and duration. In addition, without interference of an electric field generated through blanking, the deflector coils of the electron column may be utilized to control the position of the electron beam after a docking process.

Figure 1:
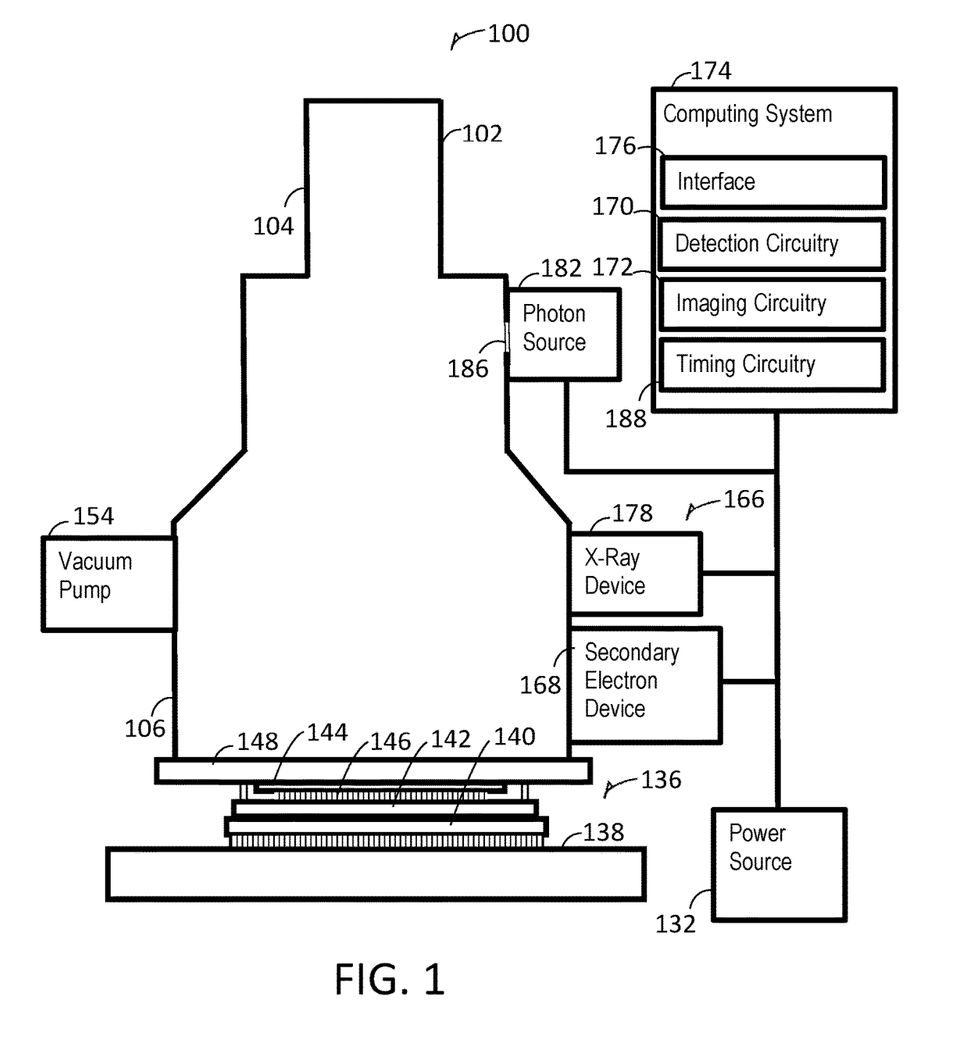
FIG. 1 is a side plan partial schematic view of a probe assembly in accordance with one example embodiment.
Figure 2:
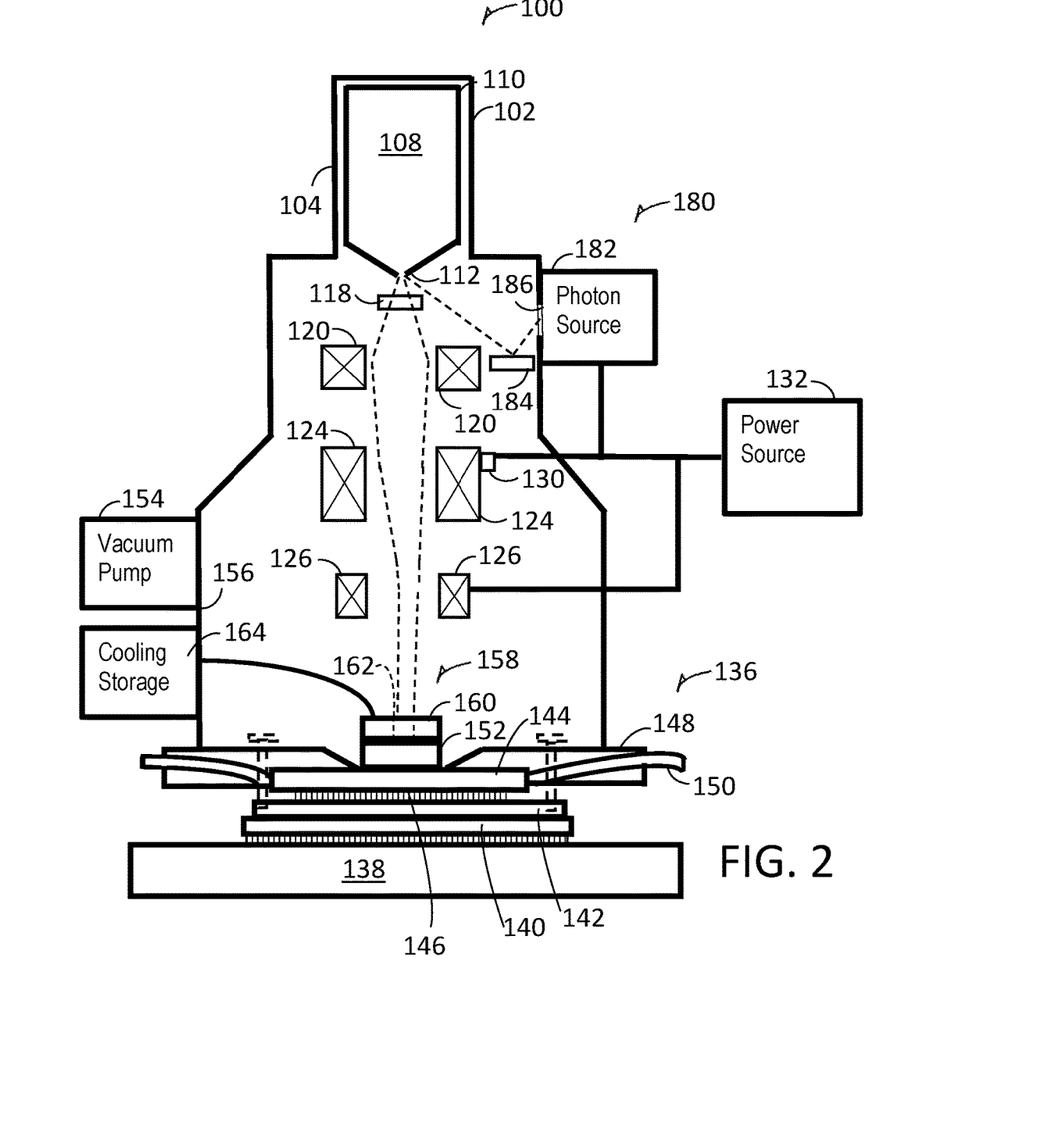
FIG. 2 is a schematic view of the probe assembly of FIG. 1 in accordance with one example embodiment.

FIGS. 1 and 2 illustrate an example of a probe assembly 100. The probe assembly 100 includes a probe housing 102 that extends from a first end 104 to a second end 106. Disposed within the first end 104 of the housing 102 is an electron source 108. The electron source in one example is an electron gun. The electron source 108 includes an electron source housing 110 that in one example is generally needle-like terminating in a tip 112. The tip 112 in one example has a diameter in a range of 1-10 nanometers (nm). A voltage potential is generated at the tip 112 by any conventional means. The voltage potential is set just below a threshold value, where at the threshold value the electron source 108 emits primary electrons to form a primary electron beam 114 and below the threshold value no electrons are emitted.

A plurality of optical components form an electron column 116 to modify the electron beam 114 as the beam 114 propagates through the probe housing 102. In one example the electron column 116 includes an anode 118, a first lens element 120, a first spray aperture 122, a second lens element 124, and a deflector device 126. The lens elements 120 and 124 may be of any type to modify properties of the electron column, including the electron beam 114 speed and spray. The lens elements 120 and 124 may be any one of, but are not limited to, a condenser lens, objective lens, magnetic lens, or the like.

In the example of FIG. 1 the second lens element is a magnetic lens element that creates a magnetic field that decreases the speed of the propagation of the electron beam 114. In such an example as shown in FIG. 1 a lens sensor 130 is utilized to determine the speed at which the electron beam 114 exits the lens element 124. The lens sensor 130 is in communication with a current source 132 to increase or decrease current to the magnetic lens to alter the magnetic field generated by the magnetic lens. In this manner, the speed of the electron beam 114 through the magnetic lens is controlled through feedback. In one example the electron beam 114 is slowed such that the energy of beam is in a range between 0.3-1.5 KeV to improve sampling.

In the example of FIG. 1, the deflector device 126 receives current from the current source 132 to create an electric field that deflects the electron beam 114. In one example, the deflector device 126 is a deflector coil. By increasing and decreasing the current the electric field is altered to control the deflection of the electronic beam 114. In some examples, other than FIG. 1, the electron column 116, utilizes additional lens elements, spray apertures, and the like as needed to modify the electron beam 114.

In the example of FIG. 1, a test assembly 136 is received and engages the housing 102 at an open second end 106. The test assembly 136 includes a tester 138, or test board, coupled to a tester interface unit 140. The tester interface unit 140 is coupled to the tester 138 in any manner, including through wire connections as shown. A test socket 142 interfaces with the tester interface unit 140 and a package 144 is coupled to the socket 142 and tester interface unit 140 through any means, including but not limited to package pin connections 146 as shown.

The test assembly 136 additionally includes a vacuum plate 148 that in secured to the package 144 and socket 142 through any means, including fasteners as shown. Air ports 150 are disposed through the vacuum plate 148 and extend away from the vacuum plate 148 to supply air flow to the package pin connections 146. Thus, supplemental cooling of the test assembly 136 is provided.

The test assembly 136 additionally includes a test device 152 coupled to the package 144. In one example, the test device 152 is one of a wire, semiconductor, a transistor, or the like. A vacuum pump 154 is adjacent the second end 106 and in communication with the interior of the housing 102. The vacuum pump 154 creates a vacuum chamber 156 within the housing 102, thus docking the test assembly 136 to the housing 102. Specifically, the vacuum plate 148 of the test assembly 136 forms an enclosure and is part of the vacuum chamber 156. The vacuum plate 148 thus provides pressure to hold the test device 152 coupled to the socket 142. By vacuum docking the vacuum plate 148 to the open end 106 of the housing 102, power may be provided at the bottom side of the test assembly 136 to the test device 152 such that the test device is active, or operating with current flowing to the test device 152, when the primary electron beam 114 strikes the test device 152 of the test assembly 136.

In the example of FIGS. 1-2 a cooling system 158 is provided for the probe assembly 100. In this embodiment the cooling system 158 includes a thermally electric device 160 coupled to the test device 152 to cool the test device 152. In the example, the thermally electric device 160 is coupled on top of the test device 152 and has a central opening 162 to allow the electron beam 114 to strike the test device 152. The thermally electric device 160 may be a Peltier cooler, a cold finger, or the like. To this end, in this embodiment a cooling storage device 164, such as a cryogenic dewar is connected to and supplies cooling fluid, such as liquid hydrogen or nitrogen, to the thermally electric device 160. In this manner, not only is the cooling provided within the vacuum chamber 156 by the cooling system 158, but also, convectively the package pin connections 146 also cool outside of the housing 102. Thus, high power densities created by the high bandwidth system are cooled simultaneously both within and outside the chamber 156.

Figure 3:
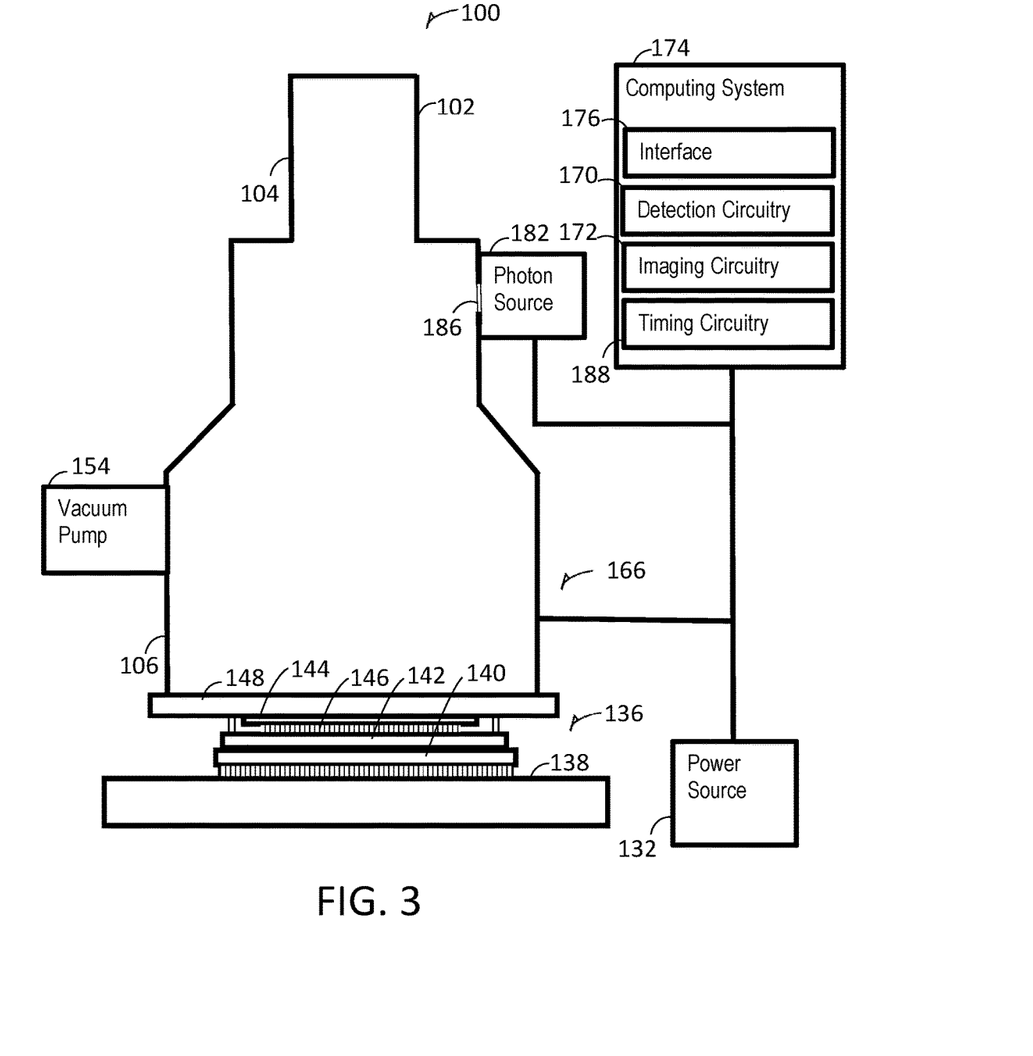
FIG. 3 is a side plan partial schematic view of a probe assembly in accordance with one example embodiment.
Figure 4:
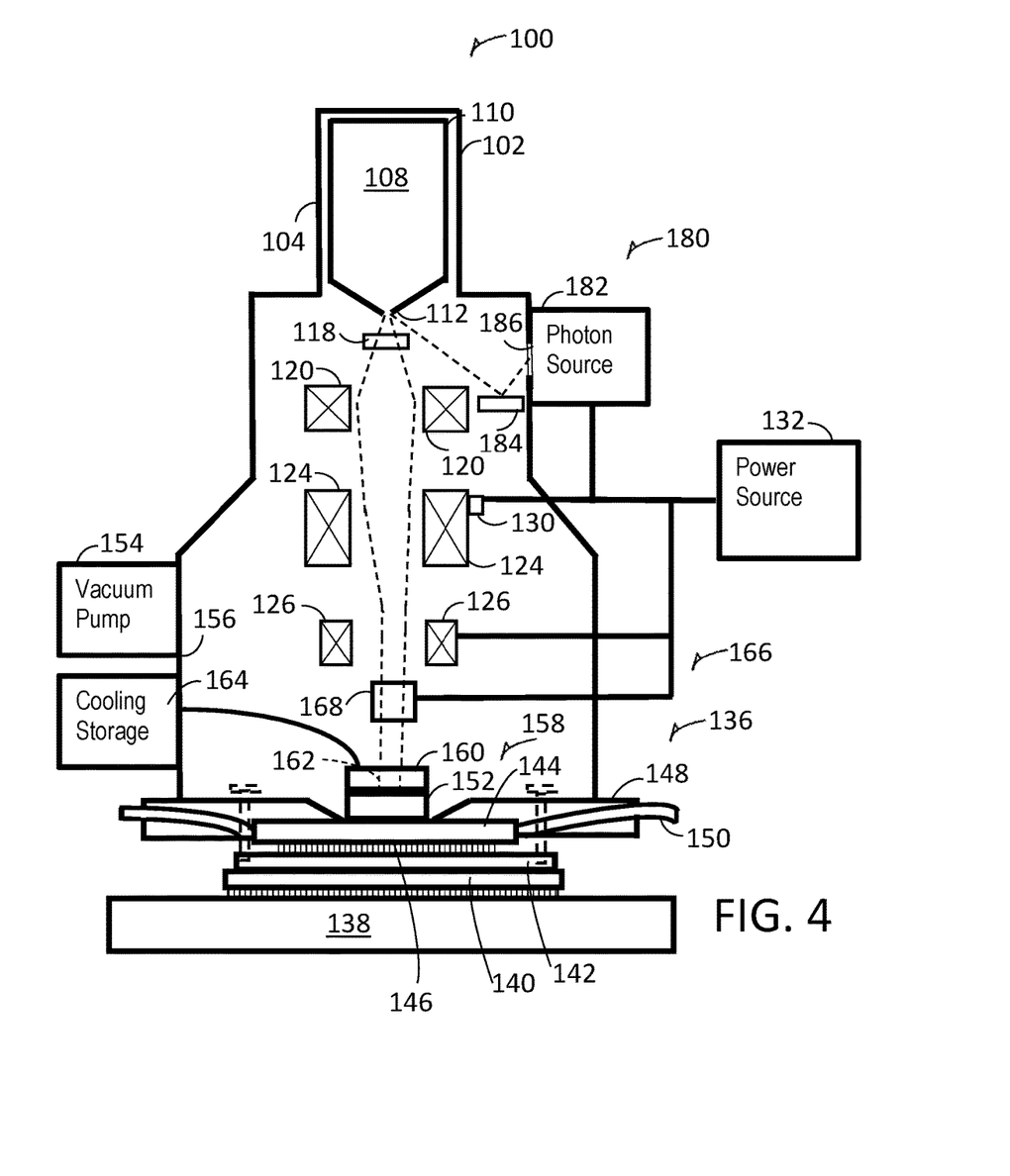
FIG. 4 is a schematic view of the probe assembly of FIG. 3 in accordance with one example embodiment.

A detection assembly 166 is disposed in the housing 102 adjacent the test assembly 136. The detection assembly 166 in one example extends through the sidewall of the housing 102. The detection assembly 166 includes a secondary electron detection device 168 that detects secondary electrons emitted from the test device 152 as a result of the electron beam 114 striking the test device 152. While in the embodiment of FIGS. 1-2 the secondary electron detection device 168 is on the side of the test device, in another example as illustrated in FIGS. 3-4 the detection device is placed in the electron beam axis. Such arrangement is considered an in-lens detection scheme. In such an arrangement the secondary electron detection device 168 utilizes a magnetic field, referred often as a magnetic immersion field, to attract the secondary electrons to the detector.

Detection circuitry 170 receives signals based on the detected secondary electrons sampled by the secondary electron detection device 168 and provides inputs for imaging circuitry 172 that forms a representative voltage waveform of the test device 152. In one example the voltage waveform is a stroboscopic time dependent voltage contrast waveform.

In one example, the detection circuitry 170 and imaging circuitry 172 are in communication with a computing system 174 such that the waveform generated by the imaging circuitry 172 displays on the interface 176 of the computing system 174 for observation by a user. In this manner, the computing system 174 provides photon time interval data to the detection circuitry 170 for use in forming the image of a voltage waveform of a test device 152. The computing system 174 in one example is in communication with the current source 132 to provide current through switches or other means as required by magnetic lens element and the deflector coils.

Additionally, in one example, the detection assembly 166 also includes an x-ray detection device 178 that may optionally be provided adjacent the test device 152 for detecting x-rays resulting from the primary electron beam 114 striking the test device 152. The signals resulting from the sampling of the x-rays emitted from the test device 152 are received by the detection circuitry 170 that communicates with the imaging circuitry 172 to form the image of the representative voltage waveform at the interface 176 of the computing system 174 as described above. In this manner, detection circuitry 170 is used in combination with the imaging circuitry 172 to form the representative voltage waveform from at least one of the secondary electrons sampled by the secondary electron detection device 168 the x-rays sampled by the x-ray detection device 178, or a combination of the secondary electrons sampled by the secondary electron detection device 168 and the x-rays sampled by the x-ray detection device 178.

By utilizing the detection assembly 166, the electron beam 114 may be aligned onto the test device 152 after the probe assembly 100 is docked to the test assembly 136 based on the secondary electron image generated by the assembly 100. When the test assembly 136 is initially docked to the probe assembly 100, the test assembly is aligned manually before actuation of the vacuum pump 154 to hermetically seal the test assembly 136 to the probe assembly. Then based on the image formed of the test assembly 136 by the imaging circuitry 172 as a result of signals received by the secondary electron detection device 168, either manually or through the computing system 174 a magnetic field is generated to deflect the electron beam 114 to align with the test device 152. In one example, as the beam 114 propagates through the electron column 116, the deflector device 126 directs the beam 114 onto the test device 152. Specifically, by increasing or decreasing current supplied to the deflector device 126 by the current source 132, the magnetic field generated by the deflector device 126 varies, moving the beam 114 in alignment with the test device 152. Therefore, the electron beam is moved after docking, without mechanical movement of the electron column 116. This eliminates undesired vibrations within the probe assembly 100. Therefore, the electron beam 114 is moved after docking without movement of the electron column 116 or test assembly 136.

As one example of such docking and alignment, often the test device 152 is a transistor of a CPU. Specifically, the CPU has numerous transistors and a two-dimensional layout of the transistor placement as was done in chip design is provided. The CPU is docked directly to the probe assembly as discussed with the region containing the transistors under test within the region disposed within the vacuum chamber 156. The assembly 100 then scans this region within the vacuum chamber 156 and compares the scan to the two-dimensional representation. Once the transistor under test is located, if the transistor under test is not on the electron beam pathway the beam is deflected as described above to strike the transistor under test during waveform acquisition.

A beam control assembly 180 regulates emission of primary electrons from the electron source 108. The assembly 180 includes a photon source 182 that in one example is a laser that emits a laser beam. In one example, the photon source 182 is disposed within the probe housing 102 and directed at the tip 112 of the electron source 108.

In another example, the photon source 182 is disposed within the probe housing 102 and directed toward a reflective device 184 that may be a mirror. The reflective device 184 directs emitted photons onto the tip 112 of the electron source 108.

In yet another example, the photon source 182 is either secured to the exterior of the probe housing 102 or located remote from the probe housing 102 and directs photons through an optical window 186 disposed within a wall of the probe housing. Again, as with previous examples, the photons of this example may either be directed at the tip 112 of the electron source 108, or at a reflective device 184 that directs emitted photons from the photon source 182 onto the tip 112 of the electron source 108. In particular, when photons strike the electron source 108, the threshold voltage value required for emission of primary electrons from the electron source 108 is met and/or exceeded.

The beam control assembly 180 also includes timing circuitry 188 that controls the emission of photons from the photon source 182. The timing circuitry 188 is in communication with the computing system 174. A user is able to provide inputs to the computing system 174, either through the interface 176 or a secondary input device such as a keyboard or mouse. Therefore, when an operator inputs the desired timing of the emission of the photons from the photon source 182 the computing system 174 synchronizes the detection circuitry 170 and timing circuitry 188 to pulse relative to a device test pattern.

Thus, when a pulsed electron emission is desired for sampling when forming a waveform, based on the input provided to the computing system 174, the timing circuitry determines a time interval for when photons are emitted from the photon source. Similarly, the timing circuit determines a time interval for when photons are not emitted from the photon source.

In one example, the time interval for photon emission is in a range between 5 ps and 20 ps. In another example the time interval for photon emission is 10 ps. In another example the time interval for when photons are not emitted from the photon source is 10 ps. In yet another example, the time interval for emission of photons is the same as the time interval for non-emission of photons. In another example the time interval for emission of photons is different than the time interval for non-emission of photons.

In one example, when the test device 152 is under test, iterative cycles are provided of the test with each iterative cycle lasting a preselected cycle period of time. In particular, the preselected cycle period of an iterative test cycle may be in a range between 5 ps and 1 sec. During a first iterative test cycle the photons emit during a preselected portion of the preselected cycle period for a preselected time interval. In one embodiment the preselected time interval is in range is between 5 ps and 20 ps. The photons then stop emitting for a pre-selected period, including in one embodiment the remainder of the preselected period of the test cycle. Then, during a second test cycle, again, photons are emitted during a portion of the preselected period of time of the test cycle for a preselected time interval. Again, the preselected time interval is in a range between 5 ps and 20 ps. During this second cycle, the portion of the preselected period of the second test cycle is different than the portion of the first preselected period. Meanwhile, the preselected time interval may be the same as the first test cycle. This procedure is then repeated iteratively during the successive iterations of cycles during the test.

By pulsing the photon source 182 to responsively pulse the electron source 108, increased sampling rates are achieved. Specifically, by utilizing the beam control assembly 180, the accuracy of the timing of both the interval of the emission of the electron beam during a test cycle, and the timing of emission during the portion of the test period cycle during a given test cycle is enhanced. As a result, the resultant bandwidth of the electron beam system 114 is increased providing a higher frequency of emissions for increased sampling resolution of the voltage waveform. Consequently, the electron beam is able to provide the time resolution scaling as well as higher spatial resolution required to provide a range of 1-10 nanometers (nm) and in one example 5 nm. Consequently, pulse rate is increased without changing an existing scanning electron microscope column.

Figure 5:
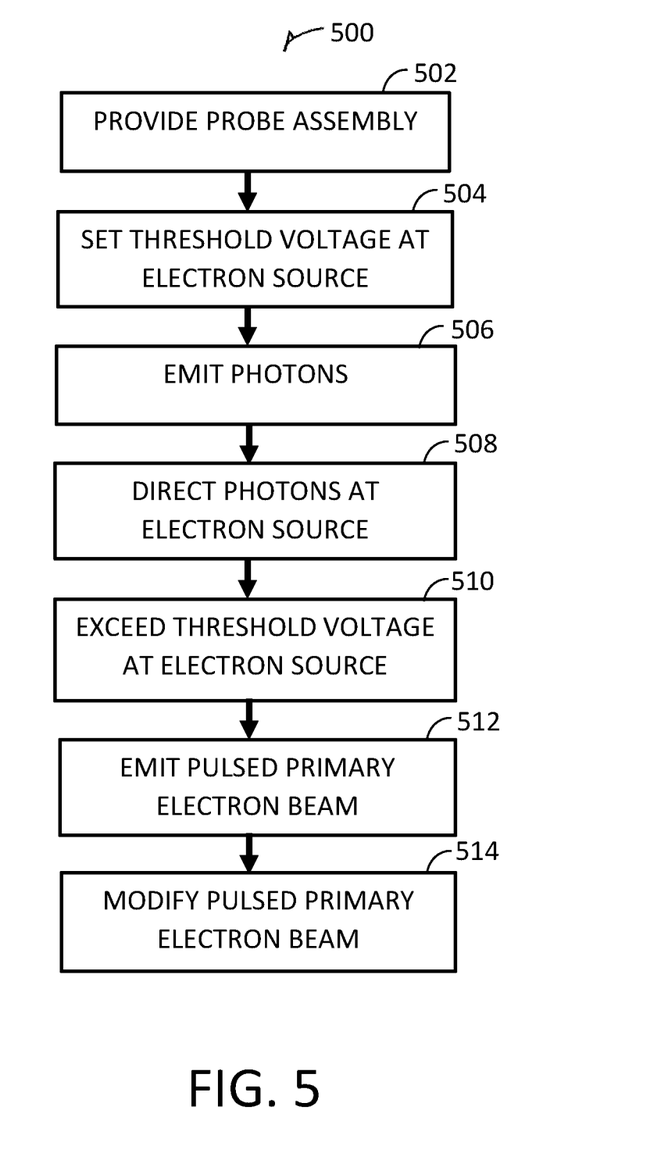
FIG. 5 is a flow diagram of a method of increasing bandwidth of a probe assembly in accordance with one example embodiment.

FIG. 5 illustrates an example method of testing a semiconductor device 500. Probe assembly 100, including all embodiments are example probe assemblies that may be used in the method 500 provided in FIG. 5. The method includes, at 502, providing a probe assembly having an electron source and an electron column. At 504, the voltage potential at the tip of the electron source is set below a threshold voltage.

At 506, a photon source emits intermittent photons. In one example, timing circuitry pulses the photons providing intervals of light and intervals of dark. At 508, emitted photons are directed at the tip of the electron source. In one example, the photon source is aimed such that photons from the photon source directly strike the tip of the electron source. In another example, the photon source is aimed such that photons from the photon source first strike a reflective device, such as a mirror, and the reflected photons strike the tip of the electron source.

At 510, the voltage at the tip of the electron source is increased above the threshold voltage when the emitted photons strike the tip of the electron source. At 512, the electron source emits a pulsed primary electron beam in response to the pulsed photons directed at the tip of the electron source. The electron source may thus be pulsed as fast as the photon source is designed to pulse, including in at approximately sub to 10 ps pulses. At 514, the electron column modifies the pulsed electron beam. Because of the increase in pulse rate to approximately 10 ps per pulse, along with improved control over accuracy in the timing of the pulses with the photon source, the resultant bandwidth is increased over previous pulsing methodologies. Thus, an improve method is presented.

Figure 6:
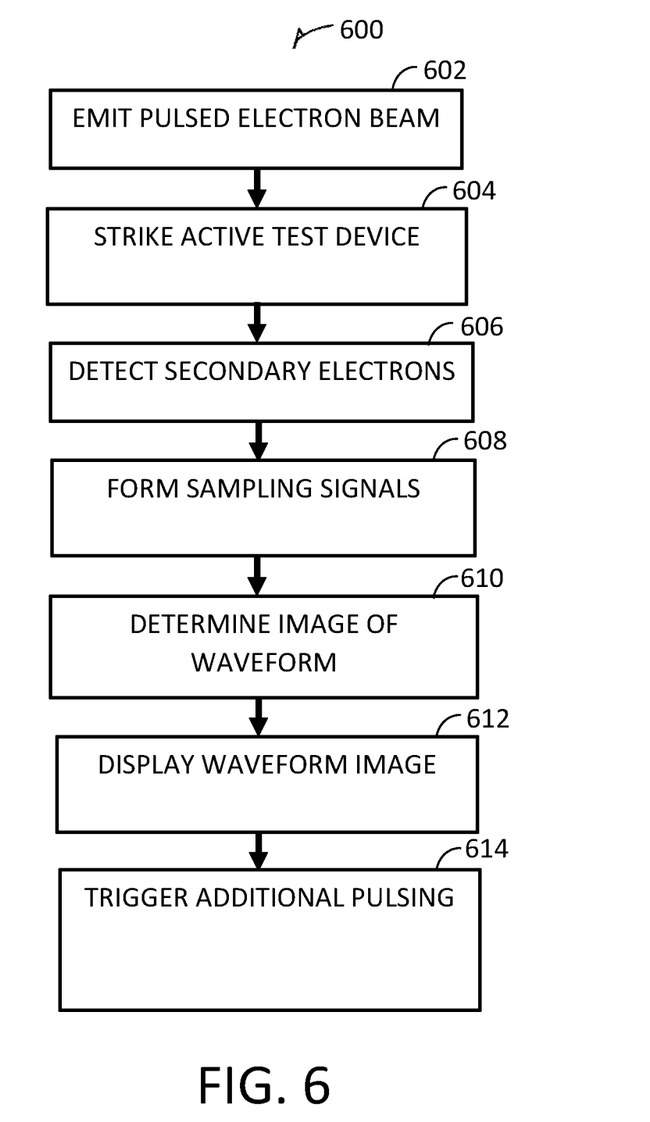
FIG. 6 is a flow diagram of a method of forming an image of a voltage waveform in accordance with one example embodiment.

FIG. 6 illustrates an example of a method of forming a voltage waveform 600. Probe assembly 100, including all embodiments are example probe assemblies that may be used in the method shown in FIG. 6. In the method, at 602, the probe assembly emits a pulsed electron beam that is directed toward an active test device utilizing the method of FIG. 5. At 604, the pulsed primary electron beam strikes the active test device to cause emission of secondary electrons from the test device. In one example, x-rays are also formed from striking the test device with the modified pulsed electron beam. At 606, the secondary electrons are detected with detection devices. In one example, x-rays are also detected at 606 with an x-ray detector.

At 608, detection circuitry forms sampling signals based on the detected secondary electrons. At 610, the imaging circuitry determines an image of the voltage wave form based on the sampling signals. At 614, the imaging circuitry displays the voltage wave form on an interface of a computing system. At 616, timing circuitry synchronizes the pulsing of the electron beam with the sampling signals to improve resolution of the image.

Figure 7:
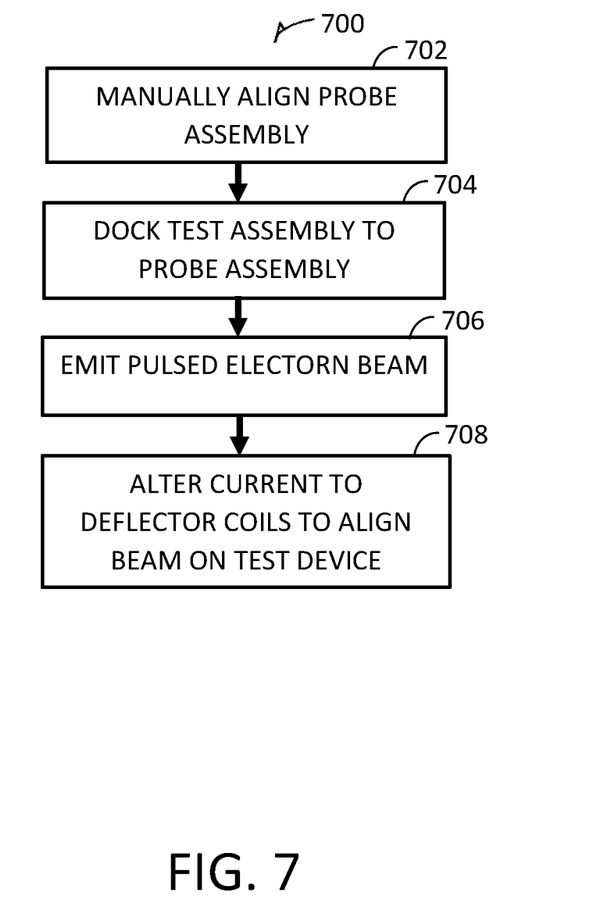
FIG. 7 is a flow diagram of a method of aligning a pulsed electron beam on a test assembly in accordance with one example embodiment.

FIG. 7 illustrates a method of aligning a pulsed electron beam on a test device. The probe assembly 100 of FIG. 1 is one example of a probe assembly that is used to accomplish this methodology. At 702, a probe assembly is manually aligned in close proximity to a test assembly. The test assembly includes a board and a test device. In an example, this alignment results in the electron beam being within a range of 100-200 ums of the test device. At 704, the board of the test assembly is docked to an end of the probe assembly. In one example this is accomplished by utilizing a vacuum pump in communication with the interior of the probe housing. As a result of the vacuum docking, wiring is run to the backside of the board to provide power to the test device such that the test device is active. The test device may be a wire, semiconductor, transistor, or the like.

At 706, the probe assembly emits a pulsed electron beam that is directed toward a test device utilizing the method of FIG. 5 to generate a waveform image. At 708, current to the deflector coils is increased or decreased to move the pulsed electron beam in alignment with the test device to strike the test device. In one example the pulsed electron beam is moved based on the waveform image generated. In one example, this alignment is provided automatically by a computing system based on the image. In this manner, the pulsed electron beam is moved after docking electrically and without mechanical movement of the electron column or probe assembly. Consequently, mechanical vibrations are eliminated and imaging improved.

Figure 8:
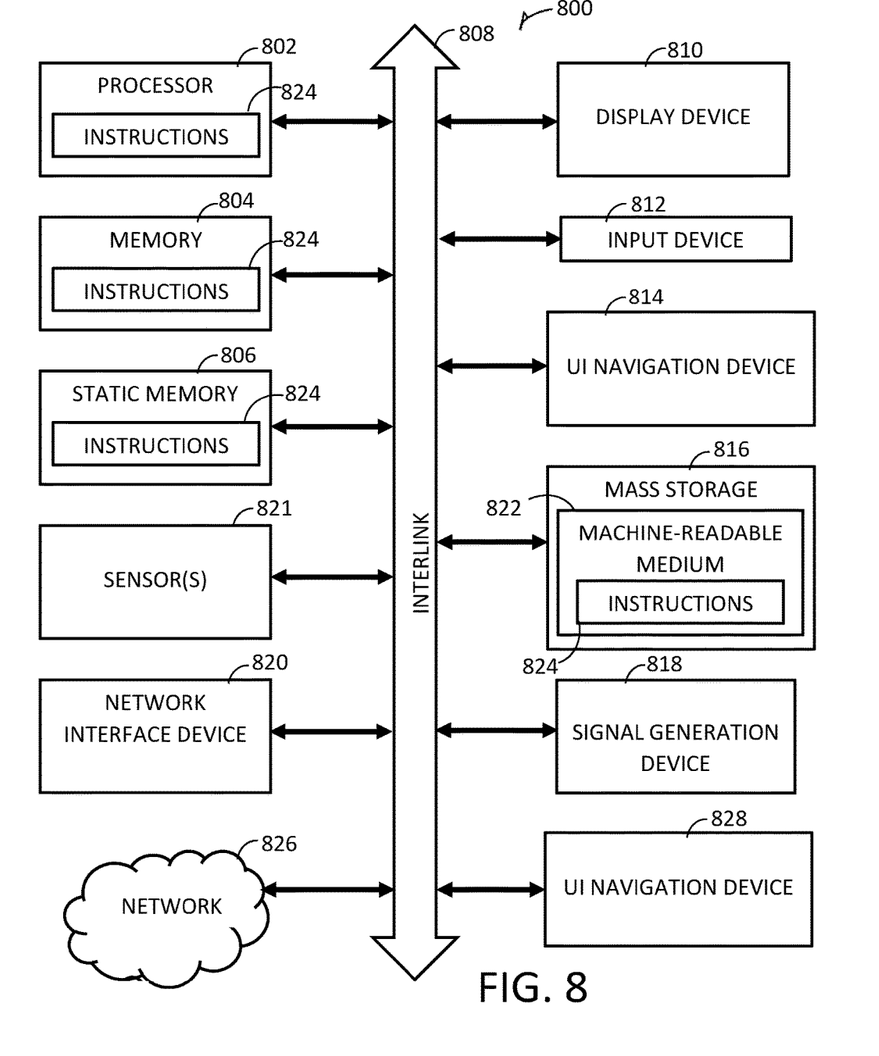
FIG. 8 is a block diagram illustrating an example of a machine upon which one or more embodiments may be implemented in accordance with one example embodiment.

FIG. 8 illustrates a block diagram of an example machine 800 upon which any one or more of the techniques (e.g., methodologies) discussed herein may perform. In alternative embodiments, the machine 800 may operate as a standalone device or may be connected (e.g., networked) to other machines. The machine 800 includes, but is not limited to, the computing system 174 of the examples of FIGS. 1-4. Thus, in the manners described in relation to the block diagram of FIG. 8, the computing system 174 as a machine 800 utilize at least the detection circuitry 170, imaging circuitry 172, and timing circuitry 188 described in relation to FIGS. 1-4 to detect the secondary electrons, form images, control emission of photons, monitor sensors, and the like.

In a networked deployment, the machine 800 may operate in the capacity of a server machine, a client machine, or both in server-client network environments. In an example, the machine 800 may act as a peer machine in peer-to-peer (P2P) (or other distributed) network environment. The machine 800 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, engines, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. The circuitry includes in examples detection circuitry 170, imaging circuitry 172, and timing circuitry 188. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

Machine (e.g., computer system) 800 may include a hardware processor 802 (e.g., a central processing unit (CPU), a graphics processing unit (GPU), a hardware processor core, or any combination thereof), a main memory 804 and a static memory 806, some or all of which may communicate with each other via an interlink (e.g., bus) 808. The machine 800 may further include a display unit 810, an alphanumeric input device 812 (e.g., a keyboard), and a user interface (UI) navigation device 814 (e.g., a mouse). In an example, the display unit 810, input device 812 and UI navigation device 814 may be a touch screen display. The machine 800 may additionally include a storage device (e.g., drive unit) 816, a signal generation device 818 (e.g., a speaker), a network interface device 820, and one or more sensors 821, such as a global positioning system (GPS) sensor, compass, accelerometer, or other sensor. The machine 800 may include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 816 may include a machine readable medium 822 on which is stored one or more sets of data structures or instructions 824 (e.g., software) embodying or utilized by any one or more of the techniques or functions described herein. The instructions 824 may also reside, completely or at least partially, within the main memory 804, within static memory 806, or within the hardware processor 802 during execution thereof by the machine 800. In an example, one or any combination of the hardware processor 802, the main memory 804, the static memory 806, or the storage device 816 may constitute machine readable media.

While the machine readable medium 822 is illustrated as a single medium, the term "machine readable medium" may include a single medium or multiple media (e.g., a centralized or distributed database, and/or associated caches and servers) configured to store the one or more instructions 824.

The term "machine readable medium" may include any medium that is capable of storing, encoding, or carrying instructions for execution by the machine 800 and that cause the machine 800 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 824 may further be transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 820 may include one or more physical jacks (e.g., Ethernet, coaxial, or phone jacks) or one or more antennas to connect to the communications network 826. In an example, the network interface device 820 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 800, and includes digital or analog communications signals or other intangible medium to facilitate communication of such software.

VARIOUS NOTES & EXAMPLES

In Example 1, a probe assembly for analyzing a test device comprising: a housing including an electron source disposed therein for emitting primary electrons; a photon source positioned to emit photons that strike the electron source such that when the photons strike the electron source, the electron source emits the primary electrons; and detection circuitry configured to detect secondary electrons emitted from a test device of a test assembly and to form an excitation waveform.

In Example 2, the subject matter of Example 1 optionally includes wherein the photon source emits pulsed photons that strike the electron source.

In Example 3, the subject matter of Example 2 optionally includes wherein a time interval between pulsed photons is in a range between 5 ps and 20 ps.

In Example 4, the subject matter of any one or more of Examples 1-3 optionally include a detection device including the detection circuitry and positioned adjacent the test device to detect the secondary electrons emitted by the test device.

In Example 5, the subject matter of Example 4 optionally includes a computing system that receives an input from the detection circuitry to form the excitation waveform.

In Example 6, the subject matter of any one or more of Examples 1-5 optionally include wherein the electron source includes a tip that is struck by the emitted photons of the photon source to emit the primary electrons.

In Example 7, the subject matter of any one or more of Examples 1-6 optionally include wherein the primary electrons form a beam.

In Example 8, the subject matter of Example 7 optionally includes at least one deflector element within the housing for deflecting the beam to the test device.

In Example 9, the subject matter of any one or more of Examples 1-8 optionally include wherein the photon source pulses the photons that strike the electron source.

In Example 10, the subject matter of any one or more of Examples 1-9 optionally include a mirror that reflects photons from the photon source to strike the electron source.

In Example 11, the subject matter of any one or more of Examples 1-10 optionally include a cooling device coupled to the test device.

Example 12 is a method for forming an excitation voltage waveform of a test device comprising: providing an electron source that emits primary electrons when above a threshold voltage; directing photons on the electron source to increase voltage at the electron source above the threshold voltage to emit primary electrons that strike the test device; detecting secondary electrons emitted by the test device after the primary electrons strike the test device; and forming the excitation voltage waveform based on the detected secondary electrons.

In Example 13, the subject matter of Example 12 optionally includes pulsing the photons directed on the electron source.

In Example 14, the subject matter of Example 13 optionally includes wherein a time interval between pulsed photons is in a range between 5 ps and 20 ps.

In Example 15, the subject matter of any one or more of Examples 12-14 optionally include wherein directing photons on the electron source comprises: emitting pulsed photons from a photon source; and reflecting the pulsed protons on the electron source.

In Example 16, the subject matter of any one or more of Examples 12-15 optionally include before to striking the test device with the primary electrons, decelerating the primary electrons.

In Example 17, the subject matter of Example 16 optionally includes wherein the primary electrons are decelerated by at least one lens element.

In Example 18, the subject matter of Example 17 optionally includes wherein the at least one lens element is a magnetic lens.

In Example 19, the subject matter of any one or more of Examples 12-18 optionally include aligning the electron source with the test device; and securing the test device in a fixed position relative to the electron source.

In Example 20, the subject matter of Example 19 optionally includes vacuum docking a test assembly including the test device to an open end of a housing of a probe assembly to form a vacuum chamber.

In Example 21, the subject matter of Example 20 optionally includes after securing the test device in a fixed position relative to the electron source, deflecting primary electrons within the probe assembly toward the test device without mechanical movement within the probe assembly.

In Example 22, the subject matter of any one or more of Examples 20-21 optionally include decreasing a test device temperature prior to the primary electrons striking the test device.

In Example 23, the subject matter of any one or more of Examples 12-22 optionally include wherein the excitation voltage waveform is a time dependent waveform.

In Example 24, the subject matter of any one or more of Examples 12-23 optionally include wherein the photons are directed on a tip of the electron source.

In Example 25, the subject matter of any one or more of Examples 12-24 optionally include wherein the test device receives current while receiving the primary electrons.

Each of these non-limiting examples may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed:

1. A probe assembly for analyzing a test device comprising:
    a housing including an electron source disposed therein for emitting primary electrons;
    a photon source positioned to emit photons that strike the electron source such that when the photons strike the electron source, the electron source emits the primary electrons; and
    detection circuitry configured to detect secondary electrons emitted from a test device of a test assembly and to form an excitation waveform.

2. The probe assembly of claim 1, wherein the photon source emits pulsed photons that strike the electron source.

3. The probe assembly of claim 2, wherein a time interval between pulsed photons is in a range between 5 ps and 20 ps.

4. The probe assembly of claim 1, further comprising:
    a detection device including the detection circuitry and positioned adjacent the test device to detect the secondary electrons emitted by the test device.

5. The probe assembly of claim 4, further comprising:
    a computing system that receives an input from the detection circuitry to form the excitation waveform.

6. The probe assembly of claim 1, wherein the electron source includes a tip that is struck by the emitted photons of the photon source to emit the primary electrons.

7. The probe assembly of claim 1, wherein the primary electrons form a beam.

8. The probe assembly of claim 7, further comprising:
    at least one deflector element within the housing for deflecting the beam to the test device.

9. The probe assembly of claim 1, wherein the photon source pulses the photons that strike the electron source.

10. The probe assembly of claim 1, further comprising a mirror that reflects photons from the photon source to strike the electron source.

11. The probe assembly of claim 1, further comprising a cooling device coupled to the test device assembly for cooling portions of the test assembly within the housing.

12. A method for forming an excitation voltage waveform of a test device comprising:
    providing an electron source that emits primary electrons when above a threshold voltage;
    directing photons on the electron source to increase voltage at the electron source above the threshold voltage to emit primary electrons that strike the test device;
    detecting secondary electrons emitted by the test device after the primary electrons strike the test device; and
    forming the excitation voltage waveform based on the detected secondary electrons.

13. The method of claim 12, further comprising pulsing the photons directed on the electron source.

14. The method of claim 13, wherein a time interval between pulsed photons is in a range between 5 ps and 20 ps.

15. The method of claim 12, wherein directing photons on the electron source comprises:
    emitting pulsed photons from a photon source; and
    reflecting the pulsed protons on the electron source.

16. The method of claim 12, further comprising before to striking the test device with the primary electrons, decelerating the primary electrons.

17. The method of claim 16, wherein the primary electrons are decelerated by at least one lens element.

18. The method of claim 17, wherein the at least one lens element is a magnetic lens.

19. The method of claim 12, further comprising:
    aligning the electron source with the test device; and
    securing the test device in a fixed position relative to the electron source.

20. The method of claim 19, further comprising:
    vacuum docking a test assembly including the test device to an open end of a housing of a probe assembly to form a vacuum chamber.

21. The method of claim 20, further comprising:
    after securing the test device in a fixed position relative to the electron source, deflecting primary electrons within the probe assembly toward the test device without mechanical movement within the probe assembly.

22. The method of claim 20, further comprising:
    decreasing a test device temperature prior to the primary electrons striking the test device.

23. The method of claim 12, wherein the excitation voltage waveform is a time dependent waveform.

24. The method of claim 12, wherein the photons are directed on a tip of the electron source.

25. The method of claim 12, wherein the test device receives current while receiving the primary electrons.

\* \* \* \* \*